(12) United States Patent
Moore

(10) Patent No.: US 8,198,927 B2
(45) Date of Patent: Jun. 12, 2012

(54) HIGH SPEED CHARGE PUMP

(75) Inventor: Ralph Moore, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 167 days.

(21) Appl. No.: 12/697,373

(22) Filed: Feb. 1, 2010

(65) Prior Publication Data

US 2011/0187426 A1  Aug. 4, 2011

(51) Int. Cl.
*H03L 7/06* (2006.01)

(52) U.S. Cl. .......................... 327/157; 327/156

(58) Field of Classification Search .................. 327/157, 327/148
See application file for complete search history.

(56) References Cited

U.S. PATENT DOCUMENTS

| | | | |
|---|---|---|---|
| 5,619,161 A | 4/1997 | Novof et al. | |
| 5,740,213 A | 4/1998 | Dreyer | |
| 6,147,561 A | 11/2000 | Rhee et al. | |
| 6,172,571 B1 * | 1/2001 | Moyal et al. | 331/11 |
| 6,222,421 B1 * | 4/2001 | Kiyose | 331/17 |
| 6,489,822 B2 | 12/2002 | Han | |
| 6,608,511 B1 * | 8/2003 | Hsu | 327/157 |
| 6,768,359 B2 * | 7/2004 | Hsu | 327/157 |
| 7,061,290 B2 * | 6/2006 | Hasegawa | 327/157 |
| 7,158,600 B2 | 1/2007 | Puccio et al. | |
| 7,285,995 B2 | 10/2007 | Kaizuka | |
| 7,365,593 B1 * | 4/2008 | Swanson | 327/536 |
| 7,427,900 B2 * | 9/2008 | Manetakis et al. | 331/17 |
| 7,782,143 B2 * | 8/2010 | Clementi | 331/16 |
| 2004/0071252 A1 | 4/2004 | Boerstler | |
| 2004/0257162 A1 * | 12/2004 | Mokeddem | 331/16 |
| 2007/0247234 A1 | 10/2007 | Roper | |
| 2009/0135885 A1 * | 5/2009 | Lin | 375/130 |

FOREIGN PATENT DOCUMENTS

| | | |
|---|---|---|
| EP | 0 671 829 | 9/1995 |
| EP | 1 014 547 | 6/2000 |

OTHER PUBLICATIONS

International Search Report and Written Opinion for PCT/US2011/021621 mailed on Mar. 22, 2011.

* cited by examiner

*Primary Examiner* — Ryan Jager

(74) *Attorney, Agent, or Firm* — Kenyon & Kenyon LLP

(57) ABSTRACT

In an embodiment, a primary charge pump and replica charge pump may be coupled to matching control mechanisms and loads. In an embodiment, the replica charge pump may produce an error current originating from charge pump timing mismatches in a steady locked loop state. The error current produced by the replica charge pump may be measured by a difference amplifier to adjust at least one current source to compensate for the error current originating from the timing mismatches. To adjust the current sources, the amplifier may cause the current source to produce an equal but opposite current to cancel the effects of the error current, resulting in a constant output voltage.

9 Claims, 8 Drawing Sheets

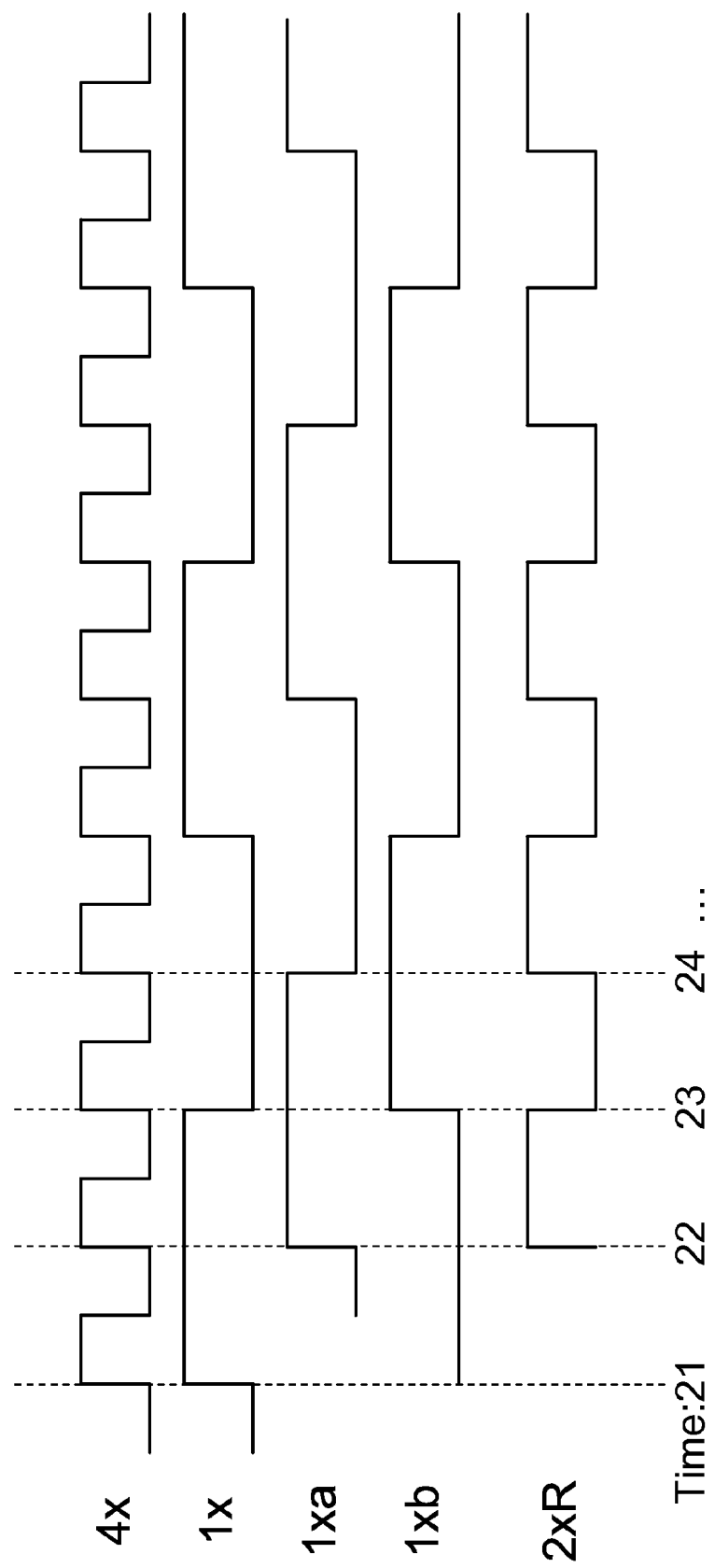

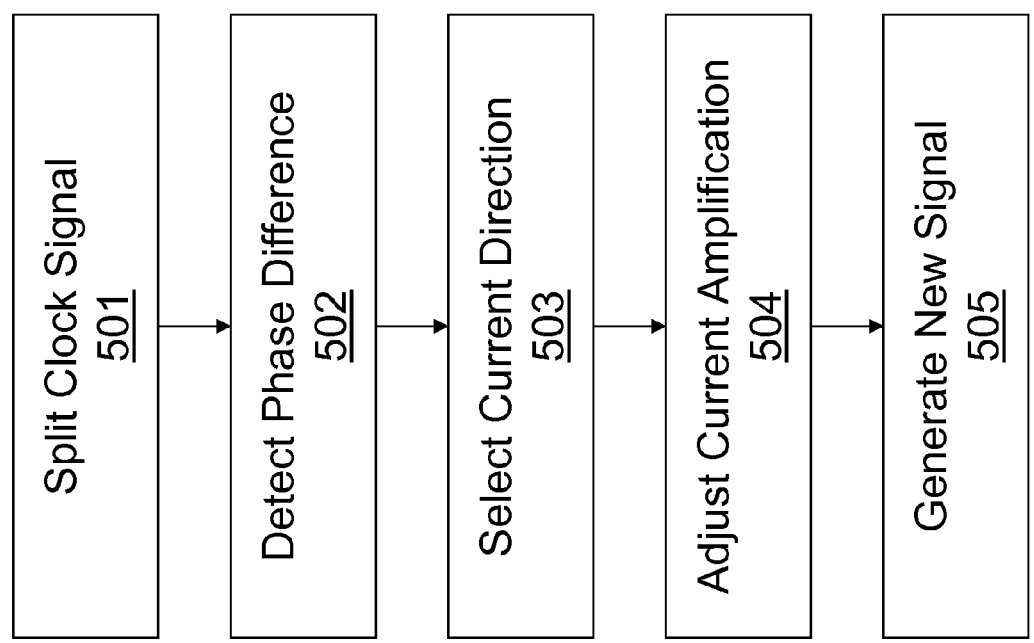

HIGH SPEED CHARGE PUMP

BACKGROUND

A charge pump in a phase compare application is used to output a current in response to a difference between two signals applied to the input of a phase or frequency comparator. A positive or negative phase difference at the input of the comparator is converted to a positive or negative current out of the charge pump. An ideal charge pump used with an ideal phase comparator should produce zero average current if no phase difference exists between the two signals being compared. However a charge pump is never ideal due to DC and transient mismatches inherent to any charge pump topology. Even if positive and negative pump current sources are perfectly matched, the time delay to enable or disable the positive and negative output currents may not be equal. The result of this timing mismatch is that even when signals with no phase difference are applied to an ideal phase comparator driving a non-ideal charge pump, the charge pump output average current will be non zero. The severity of this error worsens as the frequency of the phase comparison increases.

While others have focused on eliminating other sources of charge pump error, such as correcting static current mismatches, there is a need to eliminate these transient residual phase errors to reduce noise and offset control loop errors. The invention described is a general method for reducing the transient mismatches observed in commonly used charge pump architectures. The simple circuit techniques allow for reduced design time by boosting the performance of common architectures so that they may be used in applications demanding higher performance and accuracy.

BRIEF DESCRIPTION OF THE DRAWINGS

FIG. 1b shows an exemplary configuration of a coupled primary and replica charge pump in an embodiment shown in FIG. 1a.

FIG. 2 shows changes to an initial reference clock signal after processing through different stages in an embodiment.

FIG. 3b shows an exemplary configuration of a coupled primary and replica charge pump in an embodiment shown in FIG. 3a.

FIG. 5 shows an second exemplary method in an embodiment of the invention.

DETAILED DESCRIPTION

In an embodiment, a primary charge pump and replica charge pump may be coupled to matching control mechanisms and loads. In an embodiment, the replica charge pump may produce an error current originating from charge pump timing mismatches in a steady locked loop state. The error current produced by the replica charge pump may be measured by a difference amplifier to adjust at least one current source to compensate for the error current originating from the timing mismatches. To adjust the current sources, the amplifier may cause the current source to produce an equal but opposite current to cancel the effects of the error current, resulting in a constant output voltage.

The amplifier may control a positive or negative current source to a charge pump to ensure the output voltage remains constant. In an embodiment, the amplifier output may also be coupled to the primary charge pump current source in a feed forward fashion so the primary charge pump transient output current matches that of the replica charge pump in a locked steady state. In an embodiment, feedback in the replica charge pump may cause transient mismatches to be cancelled and in a further embodiment, the steady state voltage at the primary charge pump load may be coupled to the replica charge pump to be used as a reference voltage.

Figure 1A:
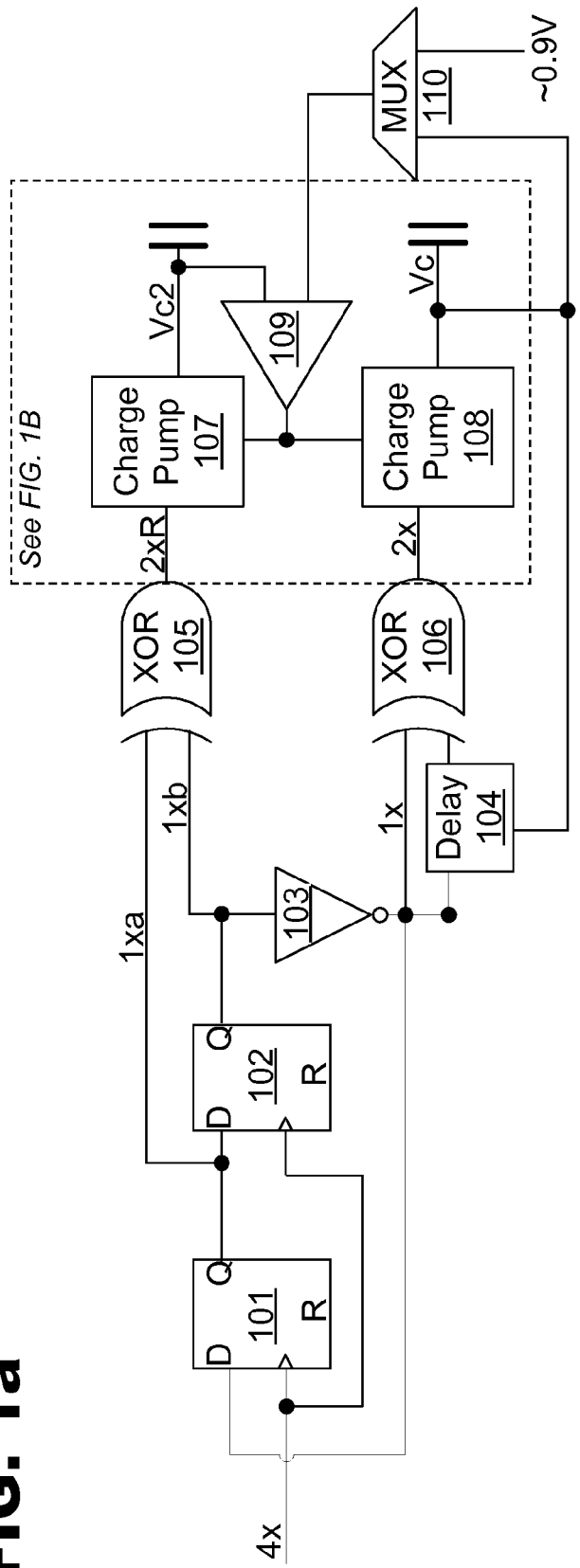
FIG. 1a shows an exemplary delay lock loop embodiment of the invention.

FIG. 1a illustrates a delay lock loop (DLL) 100 according to an embodiment of the present invention. The DLL 100 may include a pair of flip flops 101, 102 and inverter 103 connected in a loop and driven by a an input clock (4x). The DLL 100 further may include a delay element 104, a pair of XOR gates 105, 106 and a charge pump system 110. The charge pump system 110 may include a pair of charge pumps 107, 108, respective capacitors VC and VC2 and a driving amplifier 109. In other embodiments phase frequency detectors may be used instead of xor gates for phase differencing.

In the embodiment illustrated in FIG. 1a, the flip flops 101, 102 and inverter 103 generate a variety of oscillating clock signals, shown as 1xa, 1xb and 1x. In this example, the clock inputs of the flip flops 101 and 102 may both be coupled to the 4x reference clock signal. An input of the first flip flop may be coupled to the output of an inverting amplifier 103, an input of a XOR circuit 106 and an input of a delay element 104. The output of the first flip flop 101 may be coupled to the input of the second flip flop 102, and the input of a XOR circuit 105. The output of the second flip flop 102 may be coupled to the input of XOR circuit 105 and the input of inverting amplifier 103.

The output of XOR circuit 105 may be coupled to a control block of charge pump 107. an output of charge pump 107 may be coupled to a capacitor and an input of an amplifier 109. An input of amplifier 109 may also be coupled to the output of a multiplexer, mux 110. A first input of mux 110 may be coupled to a fixed reference voltage source. The fixed reference voltage source may be set to be similar to the mid point of the control voltage range of the VCO 309 or delay element 104. In an embodiment, the fixed reference voltage source may be set around the middle of the charge pump operating range. A second input of mux 110 may be coupled to the output of charge pump 108 in an embodiment. The output of charge pump 108 may also be coupled to a filter or load, which may include the capacitor coupled to the output of charge pump 107. The output of charge pump 108 may also be coupled to a control of delay element 104 to vary the amount of delay from the output of inverting amplifier 103 to an input of XOR circuit 106.

The output of the delay element 104 may be coupled to an input of XOR circuit 106. An output of XOR circuit 106 may be coupled to a control block of charge pump 108. An output from amplifier 109 may be coupled to an input of charge pumps 107 and 108.

Figure 1B:
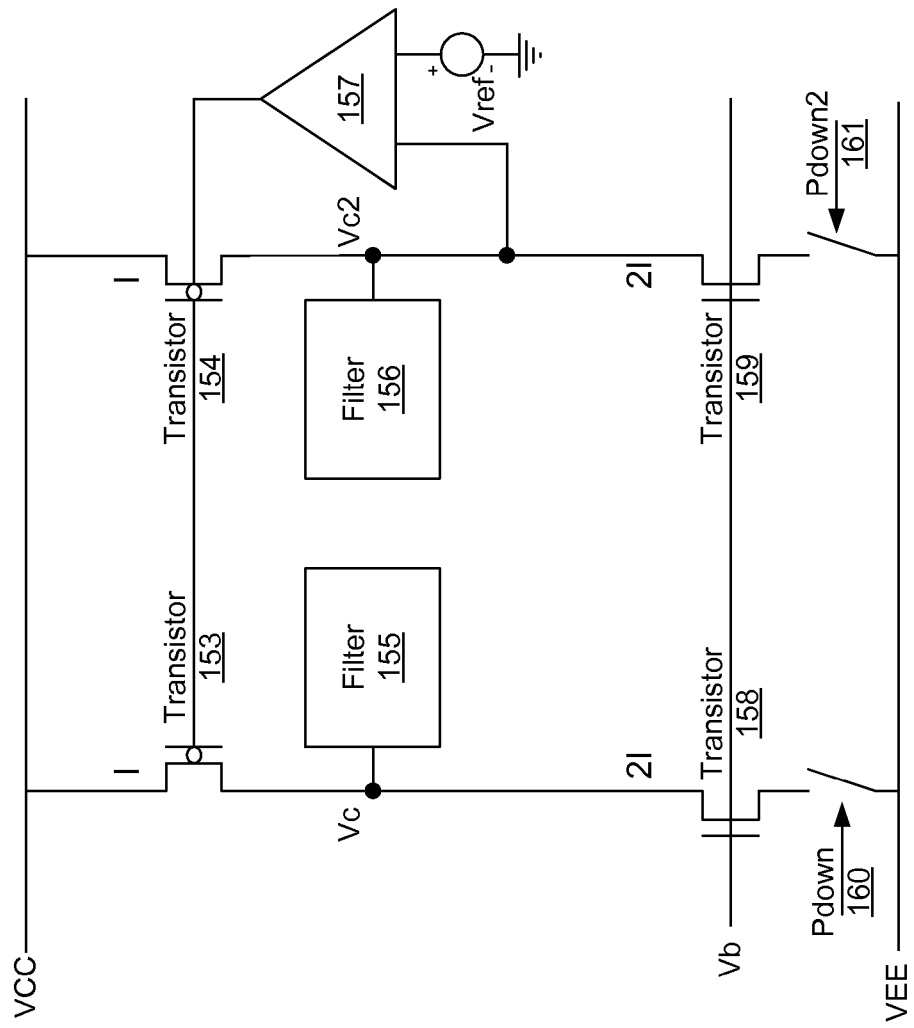

FIG. 1b shows an exemplary configuration of a coupled primary and replica charge pump in an embodiment shown in FIG. 1a. Two current paths are illustrated extending between a first voltage supply VCC and a second voltage supply VEE (say, ground). A first current path may be formed of transistors 135, 158 and a switch 160 (which itself may be a transistor). The first path may be considered to be a first charge pump. A second current path may be formed of transistors 154, 159 and switch 161 (which, again, may be a transistor). The second current path may be considered to be the replica charge pump.

Sources of transistors 153 and 154 may be coupled to a supply line VCC and the gates of the transistors 153 and 154 may be coupled to the output of amplifier 157. A drain of transistor 154 may be coupled to a filter 156, an input of an operational amplifier 157, and a third transistor 159. A reference voltage Vref may be coupled to a second input of amplifier 157. A drain of transistor 153 may be coupled to filter 155 and a fourth transistor 158. The gates of transistors 158 and 159 may be coupled to a supply line voltage Vb. In other embodiments, current sources other than transistors may be used instead.

A drain of transistor 158 may be coupled to a switch 160, which in turn may be coupled to a supply line VEE. A drain of transistor 159 may be coupled to a switch 161, which in turn may also be coupled to supply line VEE. Transistors 154 and 159 may be configured so that twice the current I flows through transistor 159 as transistor 154 when the transistors are active. Similarly, transistors 153 and 158 may be configured so twice the current flow through transistor 158 as 153. In other embodiments, the transistors may have different configurations and/or current ratios. Filters 155 and 156 may be provided as or include capacitors, for example, capacitors VC and VC2 as illustrated in FIG. 1a.

In the embodiment, the switch 160 may be configured to interact with XOR circuit 106, so that the switch 160 closes when XOR circuit 106 output is a first state (say "1") and the switch opens when XOR circuit 106 output is a second state ("0"). Similarly, switch 161 may be configured to interact with XOR circuit 105 so that when XOR circuit 105 outputs a "1", the switch is closed and when XOR circuit 105 outputs a "0", the switch is open.

The coupling shown in FIG. 1b of the primary and replica charge pumps may result in the cancellation of transient voltage mismatches at the two filters. In an embodiment, the voltage at filter 156 may be pegged to the input voltage to amplifier 157. As voltage fluctuation occur at filter 156, these fluctuations may be propagated through the amplifier 157 to the other charge pump resulting in a voltage change at filter 155 mirroring the fluctuation at filter 156. Voltage fluctuations at filter 155, however, may not be propagated to filter 156, as there is no reverse propagation path from filter 155 to 156 during stable operation. At steady state, the amplifier may force the voltages at filters 155 and 156 to match thereby cancelling any transient voltage mismatches between the filters. When the switch 161 is coupled to a reference clock signal, as shown, for example, in FIG. 1a, a replica clock signal may be generated matching the clock signal at switch 161 without dynamic mismatching errors at higher frequencies.

FIG. 2 shows changes to an initial reference clock signal after processing through different stages in an embodiment. In an embodiment, a initial reference clock signal, in this case a 4x clock signal, is coupled to the control lines of both flip flops 101 and 102, which may be initially cleared to output a zero bit signal. At time 21, a rising edge of the reference 4x clock occurs corresponding to a bit representing a '1.' The '1' sent to flip flops 101 and 102 may activate the registers, causing them each to output a '0.' The 1xa and 1xb signals may therefore also both be '0' and the XOR 105 output to the 2xR signal may also be '0.' The '0' output from flip flop 102 may be inverter at inverting amplifier 103, which may result in a '1' being sent to the input of flip flop 101. The 1x signal inputted to XOR circuit 106 and delay element 104 may also be '1.'

At time 22, a second rising edge of the reference clock signal 4x may occur corresponding to a '1' bit. The '1' bit in the 4x clock signal may trigger the flip flops 101 and 102, and the '1' previously queued in the input of flip flop 101 may be outputted from flip flop 101. Similarly, the '0' previously outputted from flip flop 101 at time 21 may be queued in the input of flip flop 102 and outputted by flip flop 102 at time 22. Thus, the 1xa signal from the output of flip flop 101 may be a '1' and the 1xb signal from the output of flip flop 102 may be a '0.' Since the 1xa signal is different from the 1xb signal, the 2xR signal at the output of XOR circuit 105 may be a '1.' The 1xb signal may be inverted to a '1' at inverting amplifier 103, result in the 1x signal at the input of XOR circuit 106 being a '1.' The inverted 1xb signal outputted from inverting amplifier 103 may then be sent to the input of flip flop 101.

At time 23, a third rising edge of the reference clock signal 4x may again trigger flip flops 101 and 102. The '1' previously queued in the input of flip flop 101 from the output of inverting amplifier 103 may be outputted from flip flop 101, and the '1' previously queued at the input of flip flop 102 from the prior output of flip flop 101 may be outputted from flip flop 102. Thus, the 1xa and 1xb signal may both be '1.' Since the 1xa and 1bx signals are both the same, the 2xR signal output of XOR circuit 105 may be '0.' The 1x signal from inverting amplifier 103 may also be '0,' and the '0' signal may be sent to the input of flip flop 101.

At time 24, a fourth rising edge of the reference clock signal 4x may trigger flip flops 101 and 102. The '0' previously queued in the input of flip flop 101 from the output of inverting amplifier 103 may be outputted from flip flop 101, and the '1' previously queued at the input of flip flop 102 from the prior output of flip flop 101 may be outputted from flip flop 102. Thus, the 1xa signal may be '0' and the 1xb signal may be '1.' Since the 1xa and 1bx signals are different, the 2xR signal output of XOR circuit 105 may be '1.' The 1x signal from inverting amplifier 103 may also be '0' after inverting the '1' in the 1xb signal and the '0' signal may be sent to the input of flip flop 101.

The delay element 104 may be initially set to a default value and may be adjusted over time so the 2xR signal matches the 2x signal at steady state. In an embodiment, the output of the charge pump 108 is used to adjust the amount of delay in the delay element 104. Mux 110 may also be used to have Vc2 track Vc and a reference voltage, such as the middle of the charge pump operating range, by switching the input to amplifier 109 between the reference voltage and the output of charge pump 108 to further tweak the voltage outputs of charge pumps 107 and 108.

Figure 3A:
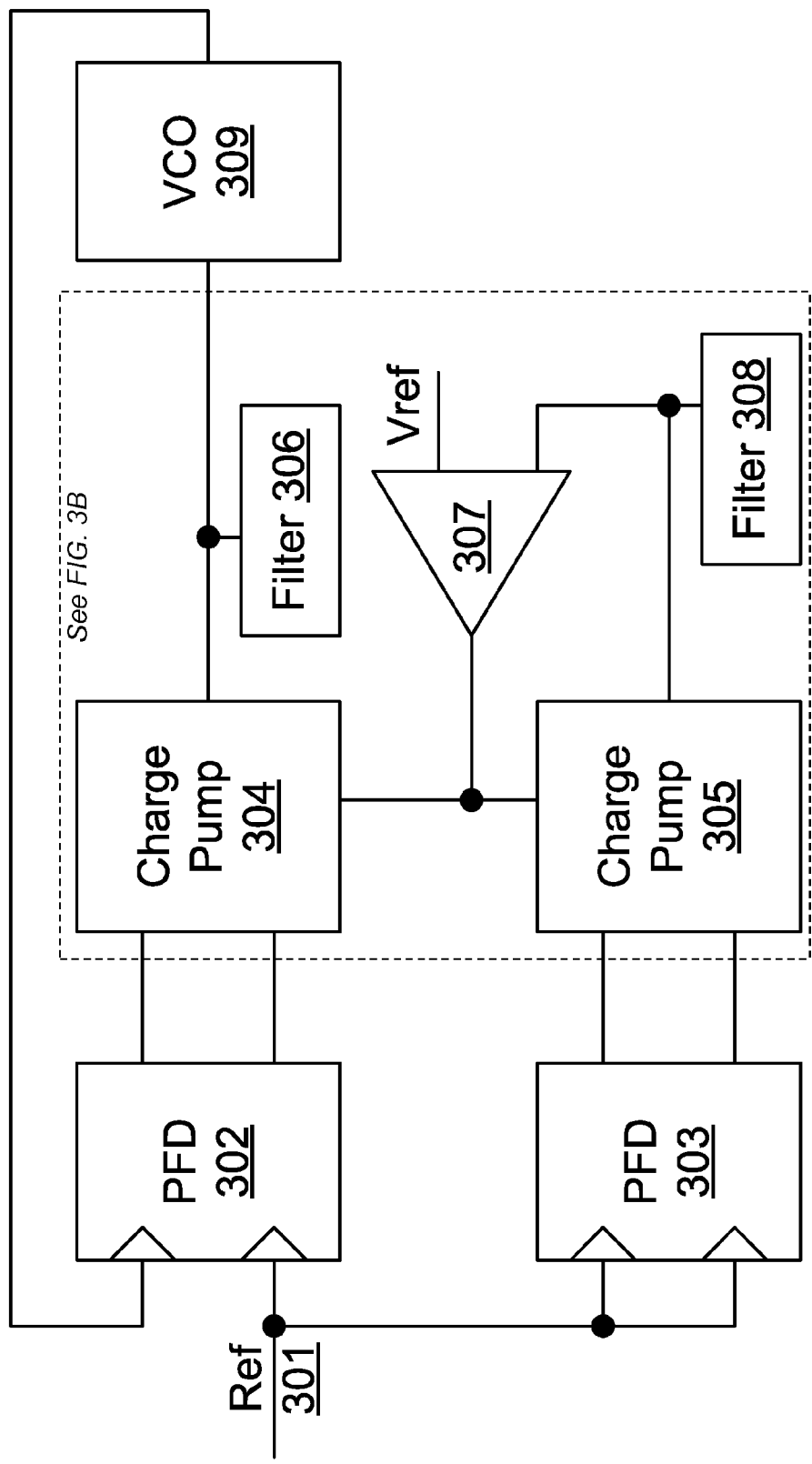
FIG. 3a shows an exemplary phase lock loop application of an embodiment of the invention.

FIG. 3a shows an exemplary phase lock loop application of an embodiment of the invention. In an embodiment, a reference signal 301 may be coupled to an input of a first phase frequency detector (PFD) 302, and to two inputs of a second PFD 303. In an embodiment, a PFD may detect the phase difference between two input signals and generate an up or down control signal when a reference signal is leading or lagging a feedback signal.

The outputs of the first PFD 301 may be coupled to a control block of a first charge pump 304 and the outputs of the second PFD 302 may be coupled to a control block of a second charge pump 305 in an embodiment. In an embodiment, the charge pump may drive current into or draw current from filter or load, which may include a capacitor, depending on whether the charge pump receives an up or down control signal from the PFD. In an embodiment, the output of the first charge pump 304 may be coupled to a filter 306 and to an input of a voltage controlled oscillator (VCO) 309.

In an embodiment, the filter 306 may convert signals from the charge pump to a control voltage used to adjust the VCO 309. The VCO 309 may output a variable oscillation frequency that varies depending on the applied voltage at the input of the VCO 309. In an embodiment, the VCO 309 may include a module reducing the output frequency by a predetermined factor of "N." In an embodiment, the output of the VCO 309 may be coupled to a second input of the first PFD 302.

In an embodiment, the outputs of the second PFD 303 may be coupled to an input of a charge pump 305. The output of charge pump 305 may be coupled to a load or filter 308, which may include a capacitor, and an input of an amplifier 307. A second input of amplifier 307 may be connected to a reference voltage Vref, such as the middle of the charge pump operating range. The output of the amplifier 307 may be coupled to an input of both charge pumps 304 and 305.

When the reference signal 301 is coupled to both inputs of PFD 303, the signals may be in phase, and PFD 303 may output both an up and down control signal to charge pump 305 in an embodiment. In an embodiment, the combined up and down control signals may result in matching currents at charge pump 305, so the resulting output at charge pump 305 may proportional to the input from the output of amplifier 307. The output at charge pump 305 may then be sent to filter 308 to generate a voltage input to amplifier 307, which may in turn output an amplified output that is inputted to charge pumps 304 and 305.

In an embodiment, charge pump 304 may receive an up or down control signal from PFD 302. In an embodiment, charge pump 304 may drive current into or draw current from filter 306 depending on whether the control signal is up or down. In an embodiment, the amount of current that is driven or drawn from the filter 306 may depend on the control signal from PFD 302. In an embodiment, the filter 306 may convert the current from charge pump 304 to a voltage for adjusting VCO 309. Over time, the control voltage to the VCO 309 may be adjusted so the VCO 309 outputs an oscillating frequency and phase matching the reference signal 301.

Figure 3B:
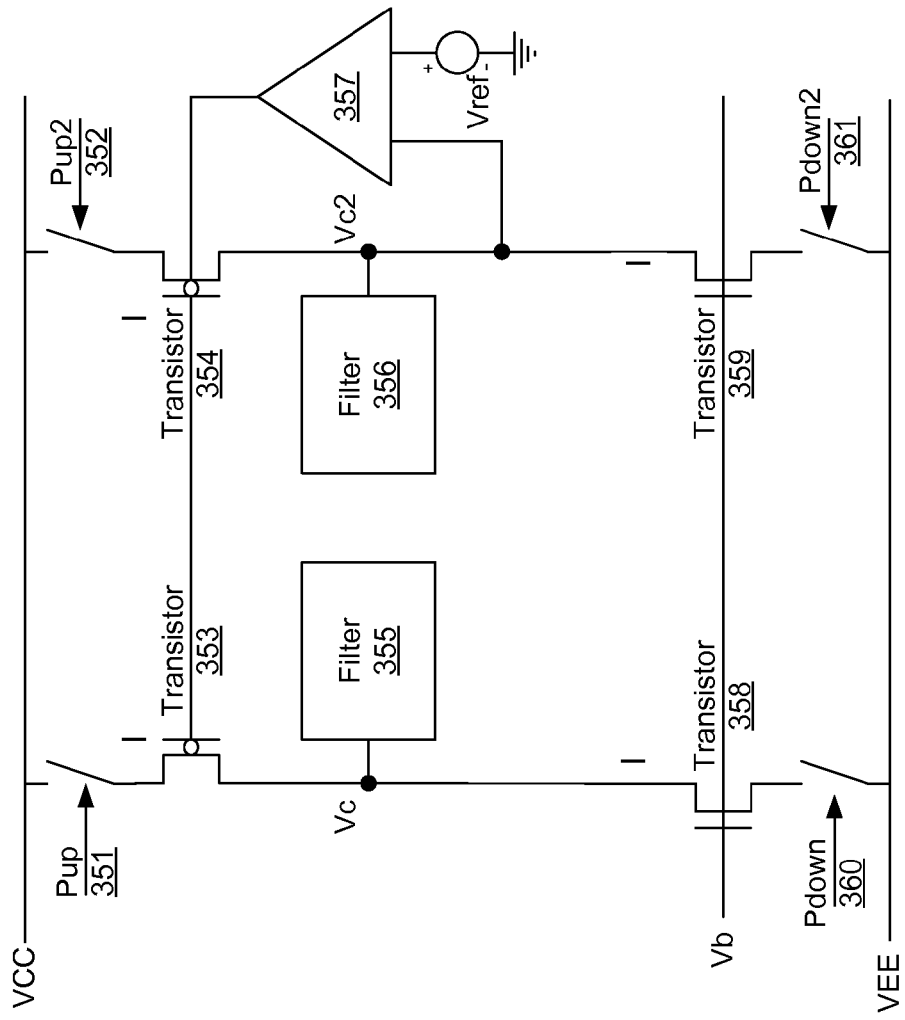

FIG. 3b shows an exemplary configuration of a coupled primary and replica charge pump in an embodiment shown in FIG. 3a. In an embodiment, transistors 353 and 354 may be coupled to switches 351 and 352 respectively, which may in turn be coupled to a supply line VCC. In an embodiment, the gates of the transistors 353 and 354 may be coupled to the output of amplifier 357. In an embodiment, the remaining end of transistor 354 may be coupled to a filter 356, an input of amplifier 357, and a third transistor 359. In an embodiment, a reference voltage Vref may be coupled to a second input of amplifier 357. In an embodiment, the remaining end of transistor 353 may be coupled to filter 355 and a fourth transistor 358. The gates of transistors 358 and 359 may be coupled to a supply line voltage Vb. In other embodiments, other current sources may be used instead of or in addition to transistors.

In an embodiment, the remaining end of transistor 358 may be coupled to a switch 360, which in turn may be coupled to a supply line VEE. In an embodiment, the remaining end of transistor 359 may be coupled to a switch 361, which in turn may also be coupled to supply line VEE. In an embodiment, each of the transistors 354 and 359 may be configured to enable currents of the same magnitude to flow through when active. In other embodiments, the transistors may have different configurations and/or current ratios. In an embodiment, filters 355 and 356 may include one or more capacitors.

In this embodiment, switch 351 may be configured to interact with the UP output of PFD 302, so that when the UP output is active, the switch 351 is closed and when the UP output is inactive, the switch 351 is open, or vise versa. In an embodiment, switch 352 may be similarly configured to interact with the UP output of PFD 303, switch 360 may be similarly configured to interact with the DOWN output of PFD 302, and switch 361 may be similarly configured to interact with the DOWN output of PFD 303. In other embodiments, the switches may have the reverse configurations, opposite configurations, or different configurations altogether.

Figure 3C:
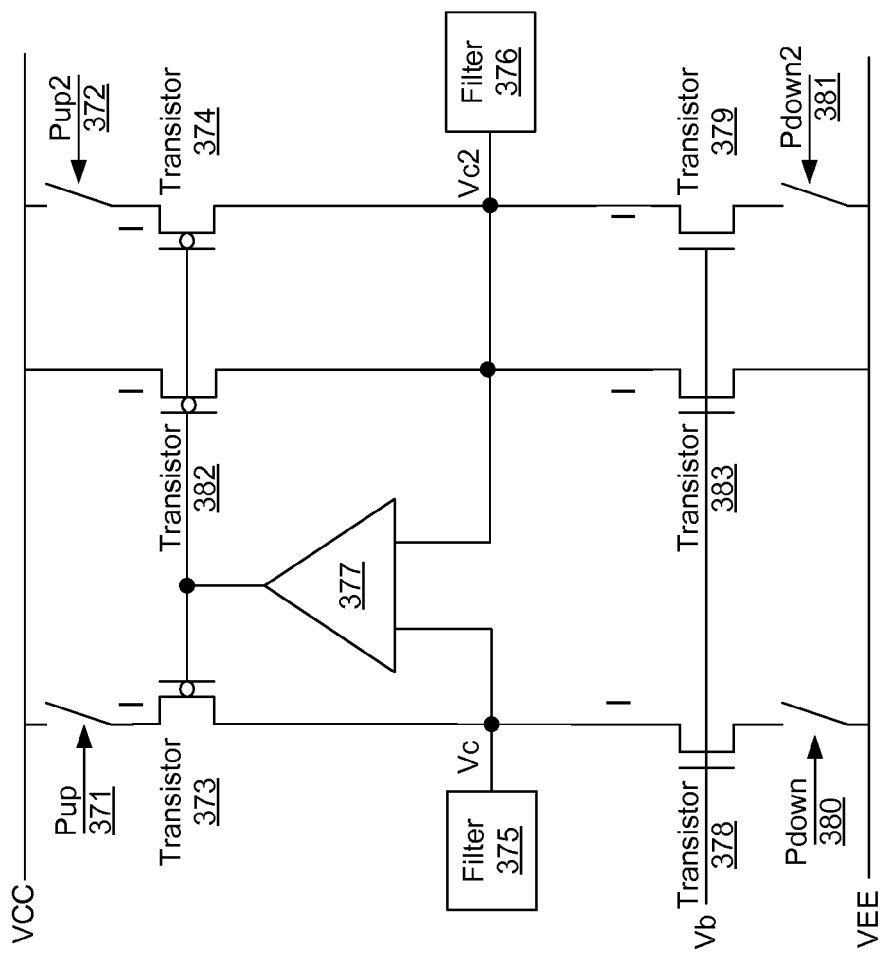
FIG. 3c shows a second exemplary configuration of a coupled primary and replica charge pump in an embodiment.

FIG. 3c shows a second exemplary configuration of a coupled primary and replica charge pump in an embodiment to correct both AC and DC error. In an embodiment, transistors 373 and 374 may be coupled to switches 371 and 372 respectively, which may in turn be coupled to a supply line VCC. Transistor 382 may bypass the switches and be connect to the supply line VCC. In an embodiment, the gates of the transistors 373, 374, and 382 may be coupled to the output of amplifier 377. In an embodiment, the remaining ends of transistors 374 and 382 may be coupled to a filter 376, an input of amplifier 377, and a third and fourth transistors 379 and 383. In an embodiment, the remaining end of transistor 373 may be coupled to filter 375, a second input of amplifier 377, and a fourth transistor 378. The gates of transistors 378, 379, and 383 may be coupled to a supply line voltage Vb. In other embodiments, other current sources may be used instead of or in addition to transistors.

in an embodiment, the remaining end of transistor 378 may be coupled to a switch 380, which in turn may be coupled to a supply line VEE. In an embodiment, the remaining end of transistor 379 may be coupled to a switch 381, which in turn may also be coupled to supply line VEE. In an embodiment, each of the transistors may be configured to enable currents of the same magnitude to flow through when active. In other embodiments, the transistors may have different configurations and/or current ratios. In an embodiment, filters 375 and 376 may include one or more capacitors.

In this embodiment, switch 371 may be configured to interact with the UP output of PFD 302, so that when the UP output is active, switch 371 is closed and when the UP output is inactive, the switch 371 is open, or vise versa. In an embodiment, switch 372 may be similarly configured to interact with the UP output of PFD 303, switch 380 may be similarly configured to interact with the DOWN output of PFD 302, and switch 381 may be similarly configured to interact with the DOWN output of PFD 303. In other embodiments, the switches may have the reverse configurations, opposite configurations, or different configurations altogether.

Figure 4:
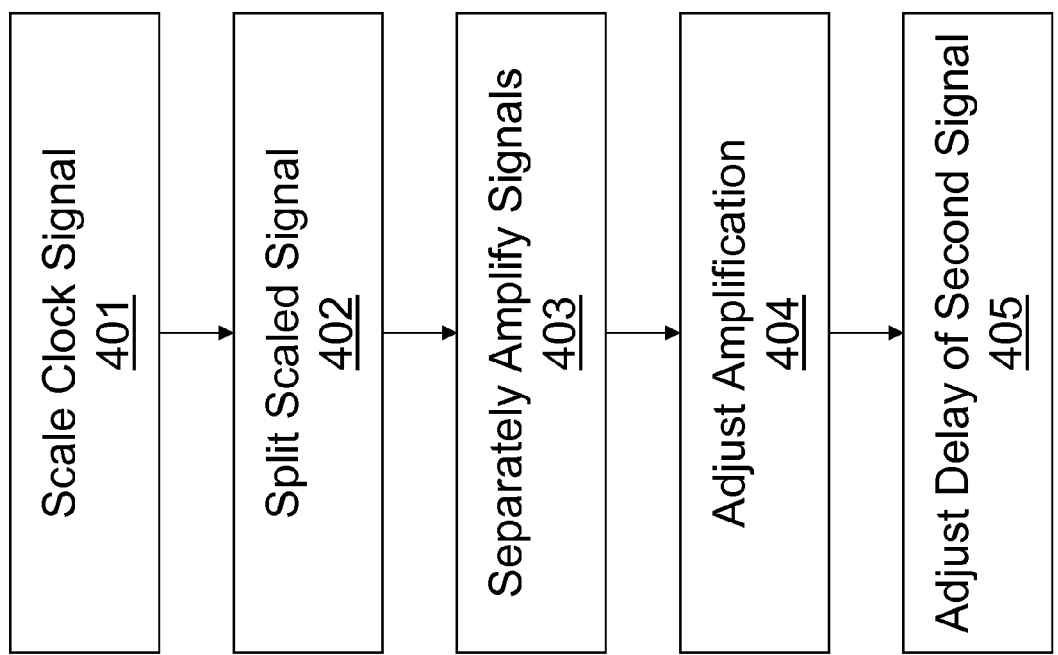
FIG. 4 shows an exemplary method in an embodiment of the invention.

FIG. 4 shows an exemplary method in an embodiment of the invention. In box 401, a reference clock signal may be scaled to achieve a desired cycle length. In some embodiments, it may desirable to have a matched path scaled clock cycle that is double the length of the original cycle time, though in other embodiments other scaled clock cycles may be more desirable.

In box 402, the clock signal may be split into a fixed clock signal component and a variable clock signal component. The fixed clock signal component may be obtained directly from the scaled reference clock signal component without any further adjustments. The variable clock signal component may include an additional variable delay element that may adjust the phase and/or clock cycle length of the clock signal.

In box 403, an initial amplified input signal may be separately adjusted based on split clock signals. In an embodiment, an initial charge pump configuration may adjust input signal according to the fixed clock signal while the replicated charge pump configuration may adjust the input signal variable clock signal.

In box 404, the results of the adjustments may result in different voltages at the output of each respective charge pump configuration. In an embodiment, the output of each charge pump may be adjusted according to the respective fixed and variable clock signals controlling each charge pump configuration, and the adjusted charge pump output may result in different voltages at the input of an amplifier, such as amplifier 109.

In box 405, the delay of the variable scaled clock signal may be adjusted based on the output of the charge pump connected to the variable clock signal. In an embodiment, the delay of the variable scaled clock signal may be adjusted to more closely match the fixed scaled clock signal, since the output of the variable scaled clock signal charge pump may be dependent in part on the output of the fixed scaled clock signal charge pump.

FIG. 5 shows an second exemplary method in an embodiment of the invention. In box 501, a reference clock signal may be split between different phase frequency detectors (PFD). In an embodiment, each of the different PFDs may be used to detect phase differences between the reference clock signal and a different second signal.

In box 502, a phase difference may be detected between the reference clock signal and each of the different second signals. In an embodiment, the second signal may also include the reference clock signal, which may trigger dead band operation as there may be no phase difference between the reference clock signal and itself. In an embodiment, the second signal may also include a signal from a voltage controlled oscillator.

In box 503, the detected phase difference may be used to select a current direction to either cause current to flow into or be drawn from a filter. In an embodiment, a filter may include a capacitor. In an embodiment, when the phase detector indicates that the second signal lags the reference clock signal, a current direction causing current to flow into a filter may be selected. In an embodiment, when the phase detector indicates that the second signal leads the reference clock signal, a current direction causing current to be drawn from a filter may be selected. In an embodiment, when the phase detector indicates that the second signal is in phase with the reference clock signal, a current direction causing current to both flow into and be drawn from the filter may be selected, resulting in no net current.

In an embodiment, a phase difference and current direction may be separately calculated for both the reference clock signal compared to a voltage controlled oscillator output signal and the reference clock signal compared to itself. In box 504, the selected current direction may be applied to an input signal to further amplify the current, either positively or negatively, in the input signal. In an embodiment, the same input signal may be amplified separately for both the reference clock signal compared to itself and the reference clock signal compared to the voltage controlled oscillator signal.

In box 505, a voltage controlled oscillator signal may be generated that is proportional to the adjusted input signal after the amplified current in the selected direction is applied. In an embodiment, the direction of the amplified current, i.e. whether current flows into or out of the filter, may depend on the detected phase difference between the reference clock signal and the prior voltage controlled oscillator output signal.

The foregoing description has been presented for purposes of illustration and description. It is not exhaustive and does not limit embodiments of the invention to the precise forms disclosed. Modifications and variations are possible in light of the above teachings or may be acquired from the practicing embodiments consistent with the invention.

I claim:

1. A charge pump system, comprising:
    a first charge pump and a second charge pump, having respective outputs coupled to respective loop filters, a loop filter of the first charge pump coupled to a load device;
    a first phase detector and a second phase detector, each having an output coupled to a respective input of one of the first and second charge pumps;
    a first flip flop having an output coupled to a first input of the second phase detector;
    a second flip flop having an input coupled to the output of the first flip flop and having an output coupled to a second input of the second phase detector;
    a delay element having an output coupled to a first input of the first phase detector and having an input coupled to: (i) an input of the first flip flop, (ii) a second input of the first phase detector; and
    an operational amplifier having an output coupled to a control input of both charge pumps and having a first input coupled to an output of a second charge pump and a second input coupled to one of a voltage reference and an output of the first charge pump.

2. The charge pump system of claim 1, wherein each of the first and second phase detectors is a XOR circuit.

3. The charge pump system of claim 2, wherein the load device is a voltage controlled oscillator.

4. The charge pump system of claim 1, further comprising an inverter coupled between the input of the delay element and either the first flip flop output or the second flip flop output.

5. The charge pump system of claim 1, wherein the output of the first charge pump is coupled to a control input of the delay element.

6. The charge pump system of claim 1, further comprising a multiplexer having a first input coupled to a reference voltage, a second input coupled to the output of the first charge pump, and an output coupled to the second input of the operational amplifier.

7. A charge pump system, comprising:
    a first charge pump and a second charge pump, having respective outputs coupled to respective loop filters, a loop filter of the first charge pump coupled to a load device;
    a frequency divider dividing an input signal into a first divided signal and a second divided signal;
    a delay element;
    a first phase detector having a first input coupled to an output of the delay element, a second input coupled to the input of the delay element, and an output coupled to an input of the first charge pump;
    a second phase detector having respective inputs coupled to the first and the second divided signals and an output coupled to an input of the second charge pump; and
    an operational amplifier having an output coupled to a control input of both first and second charge pumps and having a first input coupled to an output of the second charge pump and a second input coupled to one of a voltage reference and an output of the first charge pump.

8. The charge pump system of claim 7, wherein the frequency divider comprises:
    a first flip flop outputting the first divided signal and having an input coupled to the input of the delay element; and
    a second flip flop outputting the second divided signal and having an input coupled to the outputted first divided signal from the first flip flop; wherein the input signal is supplied as a control input to the first and the second flip flops.

9. The charge pump system of claim 8, wherein the first and the second phase detectors are XOR circuits.

* * * * *